US006759911B2

(12) United States Patent (10) Patent No.: US 6,759,911 B2
Gomm et al. (45) Date of Patent: Jul. 6, 2004

(54) DELAY-LOCKED LOOP CIRCUIT AND METHOD USING A RING OSCILLATOR AND COUNTER-BASED DELAY

(75) Inventors: Tyler J. Gomm, Meridian, ID (US); Frank Alejano, Allen, TX (US); Howard C. Kirsch, Eagle, ID (US)

(73) Assignee: Mcron Technology, Inc., Boise, ID (US)

( * ) Notice: Subject to any disclaimer, the term of this patent is extended or adjusted under 35 U.S.C. 154(b) by 30 days.

(21) Appl. No.: 09/989,209

(22) Filed: Nov. 19, 2001

(65) Prior Publication Data

US 2003/0095009 A1 May 22, 2003

(51) Int. Cl.[7] .............................................. H03L 7/085
(52) U.S. Cl. ........................... 331/10; 331/1 A; 331/17; 331/45; 331/57; 327/156; 327/158; 327/159
(58) Field of Search .............................. 331/1 A, 10, 11, 331/17, 18, 25, 45, 57; 327/156–159

(56) References Cited

U.S. PATENT DOCUMENTS

| | | | |
|---|---|---|---|
| 4,965,810 A | 10/1990 | Peischl et al. ................ 375/80 |
| 5,077,686 A | 12/1991 | Rubinstein ................... 395/550 |
| 5,574,508 A | 11/1996 | Diamant ..................... 348/511 |
| 5,675,273 A | 10/1997 | Masleid ...................... 327/156 |
| 5,910,740 A | 6/1999 | Underwood ................. 327/149 |
| 5,946,244 A | 8/1999 | Manning ..................... 365/194 |
| 5,955,905 A | 9/1999 | Idei et al. .................... 327/160 |
| 6,087,868 A | 7/2000 | Millar ......................... 327/156 |
| 6,150,856 A | 11/2000 | Morzano ..................... 327/149 |
| 6,194,932 B1 | 2/2001 | Takemae et al. ............. 327/158 |
| 6,239,641 B1 | 5/2001 | Lee ............................. 327/270 |
| 6,240,042 B1 | 5/2001 | Li .............................. 365/233 |
| 6,304,117 B1 | 10/2001 | Yamazaki et al. ........... 327/158 |
| 6,310,822 B1 | 10/2001 | Shen .......................... 365/233 |
| 6,340,904 B1 | 1/2002 | Manning ..................... 327/156 |
| 6,378,079 B1 | 4/2002 | Mullarkey ................... 713/401 |
| 6,404,248 B1 | 6/2002 | Yoneda ....................... 327/158 |
| 6,426,900 B1 | 7/2002 | Maruyama et al. .......... 365/194 |
| 6,445,231 B1 | 9/2002 | Baker et al. ................. 327/158 |
| 6,484,268 B2 * | 11/2002 | Tamura et al. .............. 713/600 |
| 6,490,207 B2 | 12/2002 | Manning ..................... 365/194 |
| 6,556,489 B2 | 4/2003 | Gomm et al. ............... 365/194 |
| 2002/0167346 A1 | 11/2002 | Yoon et al. .................. 327/158 |

OTHER PUBLICATIONS

Chae, Jeong–Seok et al., "Wide Range Single–Way–Pumping Synchronous Mirror Delay", IEEE Electronics Letter Online No. 20000711, Feb. 11, 2000, pp. 939–940.
Jang, Seong–Jin et al., A Compact Ring Delay Line for High Speed Synchronous DRAM, IEEE Symposium on VLSI Circuits Digest of Technical Papers, 1998, pp. 60–61.
Kuge, Shigehiro et al., "A 0.18 $\mu$Mb DDR–SDRAM with Low–Cost Post–Molding–Tuning Method for DLL Replica", IEEE International Solid–State Circuits Conference, Feb. 2000, pp. 402–403.

(List continued on next page.)

Primary Examiner—David C. Mis
(74) Attorney, Agent, or Firm—Dorsey & Whitney LLP

(57) ABSTRACT

A delay-locked loop includes a ring oscillator that generates a plurality of tap clock signals, with one tap clock signal being designated an oscillator clock signal. Each tap clock signal has a respective delay relative to the oscillator clock signal. The oscillator clock signal clocks a coarse delay counter to develop a coarse delay count that determines a coarse delay of a delayed clock signal. A fine delay of the delayed clock signal is determined by selecting one of the tap clock signals of the ring oscillator. The phase between an input clock signal and the delayed clock signal is determined and the coarse and fine delays adjusted in response to this phase to synchronize the delayed and input clock signals. The delay-locked loop may also monitor rising and falling edges of the input clock signal and develop corresponding rising-edge and falling-edge fine delays to synchronize rising and falling edges of the input clock signal.

45 Claims, 8 Drawing Sheets

OTHER PUBLICATIONS

Saeki, Takanori et al., "A 2.5ns Clock Access 250MHz 256Mb SDRAM with a Sychronous Mirror Delay", IEEE International Solid–State Circuits Conference, Feb. 1996, pp. 374–375.

Takai, Yasuhiro et al., A 250Mb/s/pin 1Gb Double Data Rate SRAM with a Bi–Directional Delay and an Inter–Bank Shared Redundancy Scheme, 1999.

Kuge, Shigehiro et al., "A 0.18 μm 256Mb DDR–SDRAM with Low–Cost Post–Mold–Tuning Method for DLL Replica", IEEE International Solid–State Circuits, vol. 35, No. 11, Nov. 2000, pp. 1680–1689.

* cited by examiner

DELAY-LOCKED LOOP CIRCUIT AND METHOD USING A RING OSCILLATOR AND COUNTER-BASED DELAY

TECHNICAL FIELD

The present invention relates generally to integrated circuits, and more specifically to synchronizing an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modern synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning (Manning), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKDEL signal corresponds to the internal clock signal.

FIG. 2 is a signal timing diagram illustrating various signals generated during operation of the delay-locked loop 100 of FIG. 1. In response to a rising-edge of the CLK signal at a time T0, the CLKBUF signal goes high the delay D1 later at a time T1. Initially, the variable delay VD as a value VD1, causing the CLKDEL signal to go high at a time T3 and the CLKSYNC signal to go high at a time T4. At this point, note that the positive-edge of the CLKSYNC signal at the time T4 is not synchronized with the CLK signal, which transitions high at a time T5. In response to the rising-edge of the CLKDEL signal at the time T3, the CLKFB goes high at a time T6, which occurs before a positive-edge of the CLKBUF signal occurring at a time T7. Thus, the positive-edge of the CLKFB signal occurs at the time T6 while the positive-edge of the CLKBUF occurs at the time T7, indicating there is a phase shift between the two signals. The phase detector 110 (FIG. 1) detects this phase difference, and generates the DCONT signal just after the time T7 at a time T8 which, in turn, causes the delay controller 112 (FIG. 1) to generate the DADJ signal to adjust the value of the variable delay VD to a new value VD2.

In response to the new variable delay VD2, the next rising-edge of the CLKDEL signal occurs at a time T9. The CLKSYNC signal transitions high the delay D2 later at a time T10 and in synchronism with a rising-edge of the CLK signal. At this point, the delay-locked loop 100 is locked. In response to the positive-edge transition of the CLKDEL signal at the time T9, the CLKFB signal transitions high at a time T11 in synchronism with the CLKBUF signal. Once again, the phase detector 110 (FIG. 1) detects the phase difference between the CLKBUF and CLKFB signals, which in this case, is approximately zero, and generates the DCONT signal just after the time T11 in response to the detected phase difference. In this situation, the generated DCONT signal would not cause the variable delay VD2 to be adjusted since the delay-locked loop 100 is locked. Moreover, although the relative, phases of the CLKBUF and CLKFB signals is detected in response to each rising-edge of these signals, the variable delay VD may not be adjusted immediately even where such a phase difference is detected. For example, the variable delay VD may be adjusted only when a phase difference between the CLKFB and CLKBUF signals exists for a predetermined time or exceeds a predetermined magnitude. In this way, the phase detector 110 and delay controller 112 can provide a sort of "filtering" of jitter or variations in the CLK signal, as will be understood in the art.

In the delay-locked loop 100, each cycle of the CLK signal the phase detector 110 compares rising-edges of the CLKBUF and CLKFB signals and generates the appropriate DCONT signal to incrementally adjust the variable delay VD until the delay-locked loop 100 is locked. The phase detector 110 could also compare falling-edges of the CLKBUF and CLKFB signals, as in the previously mentioned Manning patent. In this way, the delay-locked loop 100 incrementally adjusts the variable delay VD once each cycle of the CLK signal. Although the example of FIG. 2 illustrates the delay-locked loop 100 as locking and therefore synchronizing the CLK and CLKSYNC signals after only two cycles of the CLK signal, the delay-locked loop typically takes as many as 200 cycles of the CLK signal to lock. Before the delay-locked loop 100 is locked, the CLKSYNC signal cannot be used to latch signals being applied to the synchronous memory device containing the delay-locked loop. As a result, the time it takes to lock the delay-locked loop 100 may slow the operation of the associated synchronous memory device. For example, in a conventional double data rate (DDR) SDRAM, the delay-locked loop is automatically disabled when the SDRAM enters a self-refresh mode of operation. Upon exiting the self-refresh mode, 200 cycles of the applied CLK signal must then occur before read or write data transfer commands can be applied to the SDRAM.

In the delay-locked loop 100, the variable delay line 102 is typically formed from a number of serially-connected individual delay stages, with individual delay stages being added or removed to adjust the variable delay VD, as will be understood by those skilled in the art. For example, a plurality of serially-connected inverters could be used to form the variable delay line 102, with the output from different inverters being selected in response to the DADJ to control the variable delay VD. A large number of stages in the variable delay line 102 is desirable with each stage having an incremental delay to provide better resolution in controlling the value of the variable delay VD, where the resolution of the delay-locked loop 100 is the smallest increment of delay that may be added and subtracted from the variable delay VD.

The variable delay line 102 may include separate coarse and fine delay lines that incrementally adjust the variable delay VD by a unit coarse delay CD and a unit fine delay FD, respectively, responsive to the DADJ signal. In this situation, the variable delay VD equals a number M of unit coarse delays CD being utilized plus a number N of unit fine delays FD being utilized (VD=M×CD+N×FD). By separating the delay line 102 into coarse and fine delay lines, the variable delay VD may be more quickly adjusted, enabling the delay-locked loop 100 to more quickly lock. With this approach, however, the resolution of the delay-locked loop 100 may be adversely affected by the use of separate coarse and fine delay lines due to the variations between the unit coarse delays CD and unit fine delays FD. Ideally, each unit coarse delay CD equals Q unit fine delays FD (CD=Q×FD) where Q is an integer. When Q×FD does not equal CD, the resolution of the delay-locked loop 100 may be adversely affected since the sum of the coarse delays CD plus the fine delays FD being utilized may vary from the desired variable delay VD by more than the fine delay FD, as will be appreciated by those skilled in the art.

In addition, the variable delay line 102 must be able to provide the maximum variable delay VD corresponding to the CLK signal having the lowest frequency in the frequency range over which the delay-locked loop is designed to operate. This is true because the variable delay line 102 must provide a variable delay VD of NTCK−(D1+D2), which will have its largest value when the period of the CLK signal is greatest, which occurs at the lowest frequency of the CLK signal. The desired fine resolution and maximum variable delay VD that the variable delay line 102 must provide can result in the delay line consisting of a large number of individual delay stages that consume a relatively large amount of space on a semiconductor substrate in which the delay-locked loop 100 and other components of the synchronous memory device are formed. Moreover, such a large number of individual delay stages can result in significant power consumption by the delay-locked loop 100, which may be undesirable particularly in applications where the synchronous memory device is contained in a portable battery-powered device.

There is a need for a delay-locked loop that occupies less space on a semiconductor substrate and consumes less power.

SUMMARY OF THE INVENTION

According to one aspect of the present invention a delay-locked loop includes a ring oscillator that generates a plurality of tap clock signals, with one tap clock signal being designated an oscillator clock signal. Each tap clock signal has a respective delay relative to the oscillator clock signal. A coarse delay circuit is coupled to the ring oscillator and generates a coarse delay count in response to the oscillator clock signal. The coarse delay circuit also generates a coarse reference count in response to a coarse delay control signal and activates a coarse delay enable signal in response to the coarse delay count being equal to the coarse delay reference count. The coarse delay circuit resets the coarse delay count responsive to a reset signal.

A fine delay circuit is coupled to the ring oscillator to receive the tap clock signals and operates in response to a fine delay control signal to select one of the tap clock signals that is then output as a fine delay enable signal. An output circuit is coupled to the coarse and fine delay circuits and generates a delayed clock signal responsive to the coarse and fine delay enable signals going active. The delayed clock signal is applied as the reset signal to the coarse delay circuit to reset the coarse delay count. A comparison circuit receives an input clock signal and is coupled to the output circuit to receive the delayed clock signal and also coupled to the coarse and fine delay circuits. The comparison circuit generates the coarse and fine delay control signals in response to the relative phases of the delayed and input clock signals.

According to another aspect of the present invention, the delay-locked loop monitors rising and falling edges of the input clock signal and develops corresponding rising-edge and falling-edge fine delays to synchronize rising and falling edges of the input clock signal. Dual coarse delays for rising and falling edges may also be timed.

DETAILED DESCRIPTION OF THE INVENTION

Figure 1:
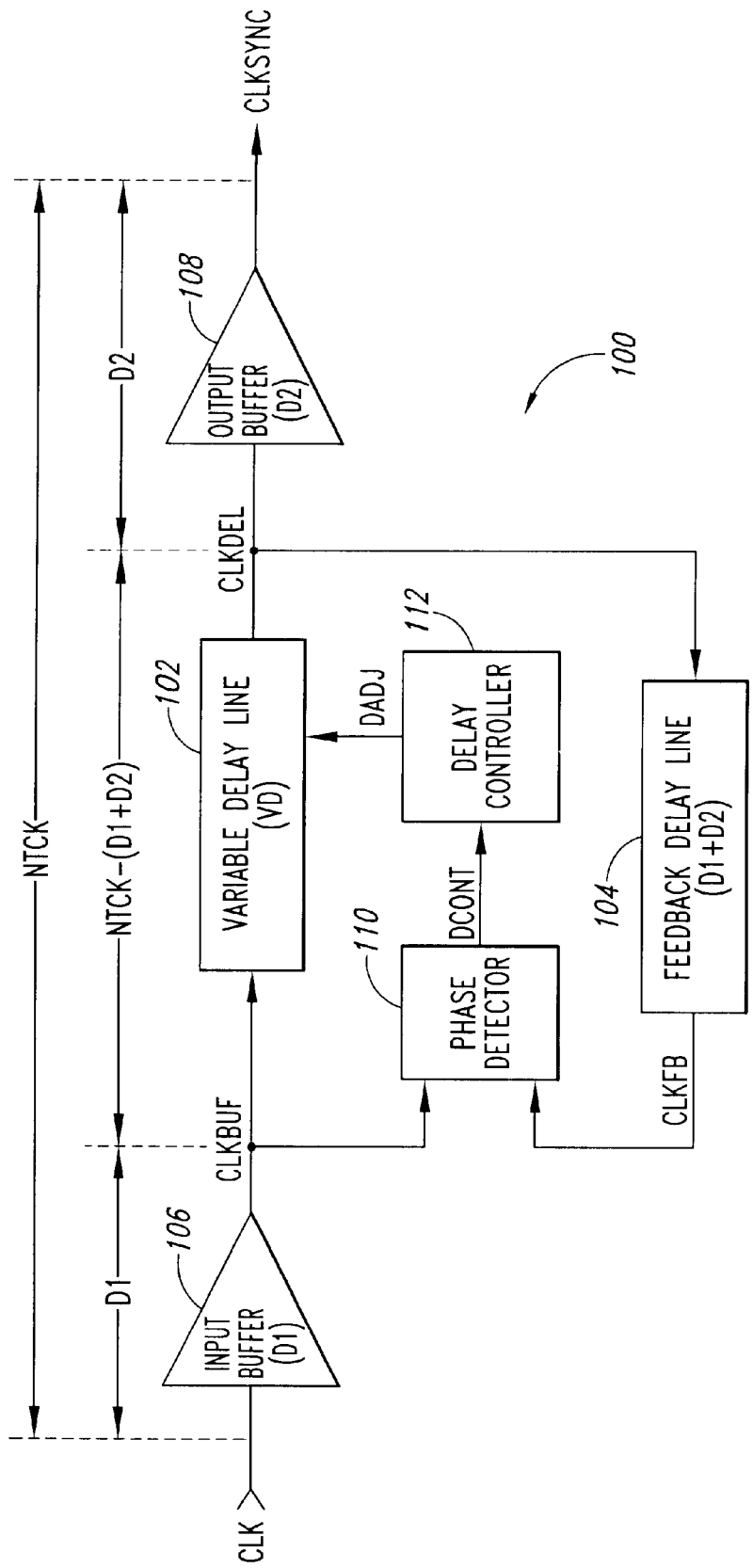
FIG. 1 is a functional block diagram of a conventional delay-locked loop.
Figure 2:
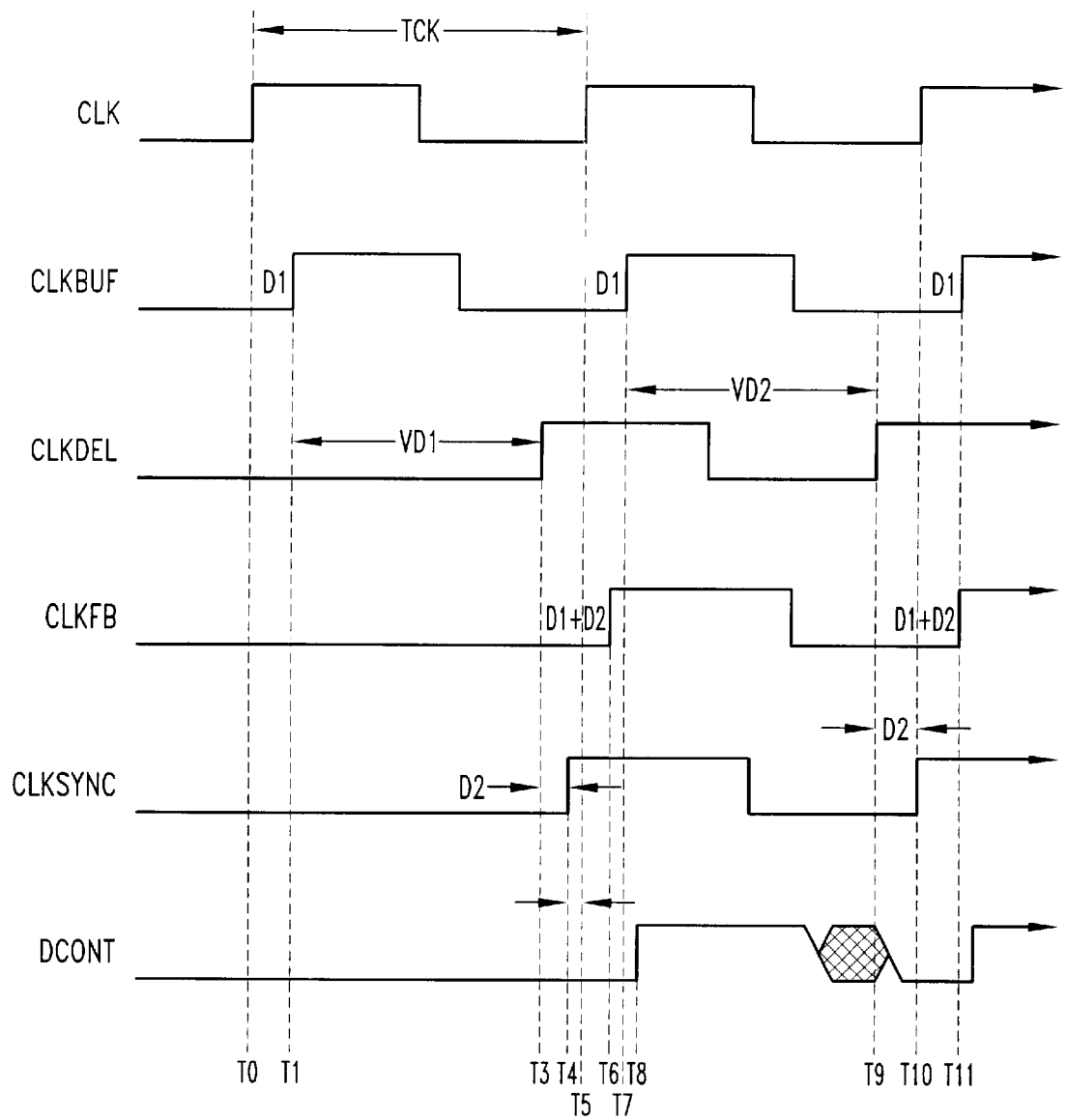
FIG. 2 is a signal timing diagram illustrating various signals generated during operation of the delay-locked loop of FIG. 1.
Figure 3:
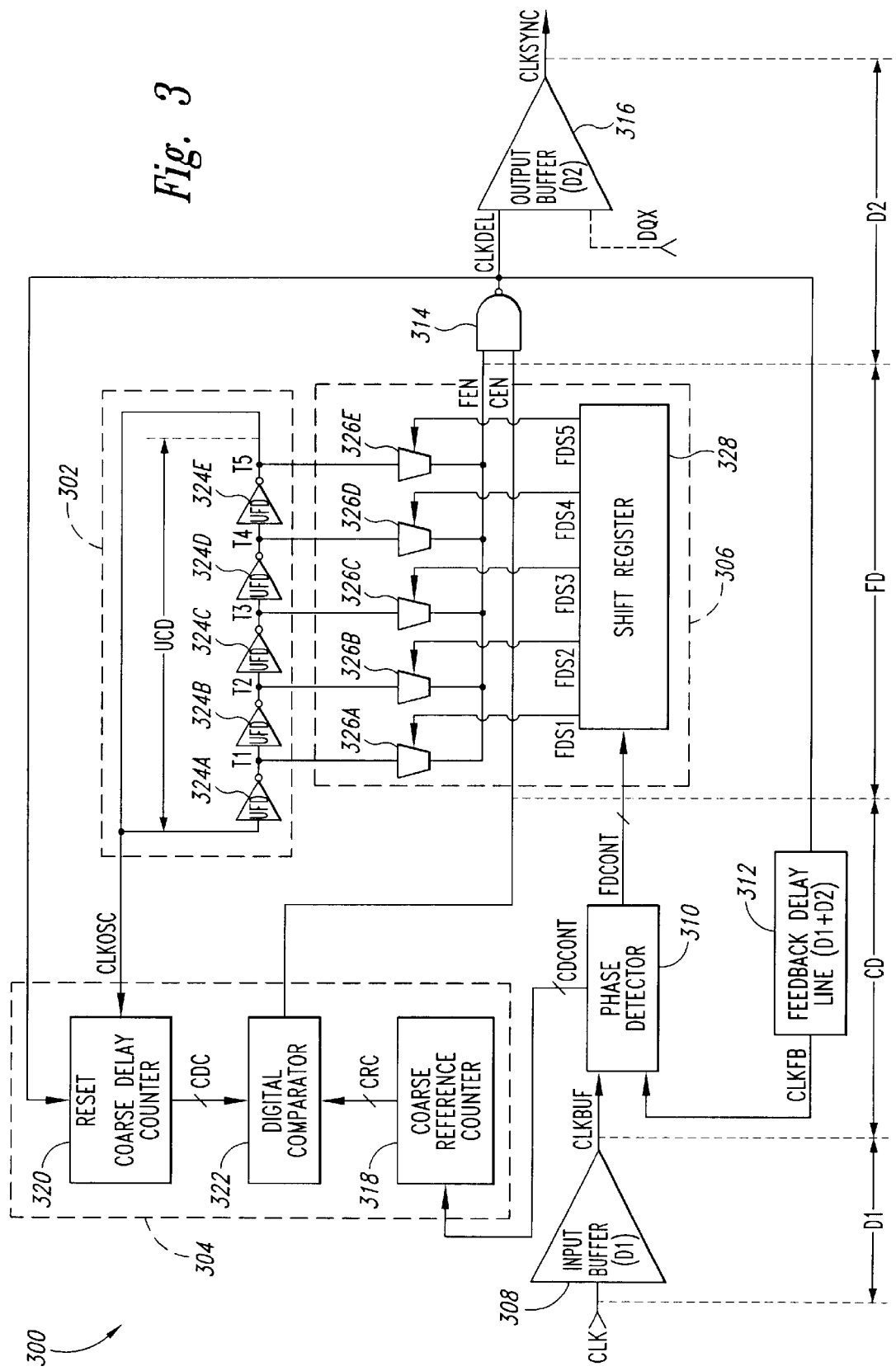
FIG. 3 is a functional block diagram of a delay-locked loop including a ring oscillator and delay counters according to one embodiment of the present invention.

FIG. 3 is a functional block diagram of a delay-locked loop 300 that eliminates the large and relatively high power variable delay line 102 contained in the conventional delay-locked loop 100 of FIG. 1, and instead includes a ring oscillator 302 that clocks coarse delay circuitry 304 to generate a coarse delay CD and also provides a plurality of tap clock signals T1–T5 from which fine delay circuitry 306 generates a fine delay FD. The delay-locked loop 300 adjusts the values of the coarse and fine delays CD, FD to generate a synchronized clock signal CLKSYNC that is synchronized with an external clock signal CLK, as will be described in more detail below. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

In the delay-locked loop 300, an input buffer 308 receives the CLK signal and develops a clock buffer signal CLKBUF in response to the CLK signal. The input buffer 308 introduces an input buffer delay D1, causing the CLKBUF signal to be delayed by the input buffer delay. D1 relative to the CLK signal. A phase detector 310 receives CLKBUF signal and a feedback clock signal CLKFB from a feedback delay line 312, and generates a coarse delay control signal CDCONT and a fine delay control signal FDCONT in response to the detected phase difference. The CDCONT and FDCONT signals are applied to the coarse delay circuitry 304 and fine delay circuitry 306, respectively, to adjust the coarse and fine delays CD, FD generated by these circuits, as will be described in more detail below.

The feedback delay line 312 receives the CLKDEL signal from an AND gate 314 and generates the CLKFB signal in response to the CLKDEL signal, with the CLKFB signal having a model delay D1+D2 relative to the CLKDEL signal. The AND gate 314 generates the CLKDEL signal in response to a coarse delay enable signal CEN from the coarse delay circuitry 304 and a fine delay enable signal FEN from the fine delay enable circuitry 306. An output buffer 316 generates a synchronized clock signal CLKSYNC signal in response to the CLKDEL signal, the CLKSYNC being synchronized with the CLK signal. The output buffer 316 introduces an output buffer delay D2, causing the CLKSYNC signal to be delayed by this amount relative to the CLKDEL signal. As illustrated by a dotted line in FIG. 3, the output buffer 316 may correspond to a data driver that receives a data signal DQX and outputs the data signal in response to being clocked by the CLKDEL signal, as will be appreciated by those skilled in the art.

The coarse delay circuitry 304 includes a coarse reference counter 318 that generates a coarse reference count CRC in response to the CDONT signal from the phase detector 310. Recall, the phase detector 310 develops the CDCONT in response to the relative phases of the CLKBUF and CLKFB signals, and thus the CRC count has a value that is a function of the detected relative phases. A coarse delay counter 320 is clocked by an oscillator clock signal CLKOSC from the ring oscillator 302, and develops a coarse delay count CDC in response to the CLKOSC signal. The counter 320 increments the CDC count in response to each transition of the oscillator clock signal CLKOSC, thus each increment of the CDC count corresponds to a unit coarse delay UCD having a value that corresponds to one-half the period of the CLKOSC signal, which will hereinafter be referred to as a "half-cyle." The counter resets the CDC count in response to a rising-edge of the CLKDEL signal. A digital comparator 322 receives the CRC and CDC counts, and applies an active coarse enable signal CEN to the AND gate 314 when the two counts are equal, which occurs after the coarse delay counter 320 has been clocked N times, where N is the number of half cycles of the CLKOSC signal required to increment the CDC count to equal the CRC count. In this way, the digital comparator 322 activates the CEN signal after N half-cycles of the CLKOSC signal to define the coarse delay CD of the CLKDEL signal having a value of N×UCD, as will be discussed in more detail below.

The ring oscillator 302 includes a plurality of the inverters 324A–E connected in series, with the output from the last inverter 324E generating the CLKOSC signal and being fed back and applied to the input of the first inverter 324A. The outputs from the inverters 324A–E generate tap clock signals T1–T5, each tap clock signal having a unit fine delay UFD relative to the preceding tap clock signal. Note that the tap clock signal T5 corresponds to the CLKOSC signal, and these two designations will be used interchangeably below when referring to this signal. The unit fine delay UFD corresponds to the respective propagation delays of the inverters 324A–E. Thus, the tap clock signal T1 is inverted and has a delay UFD relative to the CLKOSC signal, as does the tap clock signal T2 relative to the tap clock signal T1, and so on for the remaining tap clock signals T3 and T4. The tap clock signals T1–T5 are utilized by the fine delay circuitry 306 in generating the fine delay FD of the CLKDEL signal, as will be described in more detail below. The total delay of the CLKOSC signal through the inverters 324A–E corresponds to the unit coarse delay UCD which, as previously described, is the delay corresponding to each increment of the CDC count from the coarse delay counter 320. The ring oscillator 302 may include more or fewer inverters 324, as will be appreciated by those skilled in the art.

The fine delay circuitry 306 includes a plurality of transmission gates 326A–E coupled to receive the tap clock signals T1–T5, respectively. Each transmission gate 326A–E also receives a corresponding fine delay selection signal FDS1–FDS5 from a shift register 328, which activates a selected one of the FDS1–FDS5 signals in response to the FDCONT signal from the phase detector 310. The transmission gate 326A–E that receives the activated FDS1–5 signal turns ON, applying the corresponding tap clock signal T1–T5 as the fine delay enable signal FEN to the AND gate 314. Recall, the phase detector 310 generates the FDCONT signal to adjust the fine delay FD of the CLKDEL signal. By selecting which tap clock signal T1–T5 is applied as the FEN signal to the AND gate 314, the time at which the AND gate activates the CLKDEL signal is adjusted to thereby adjust the fine delay FD of the CLKDEL signal, as will be described in more detail below. One skilled in the art will appreciate various circuits that may be utilized to form the components 302–328 of the delay-locked loop 300.

Figure 4:
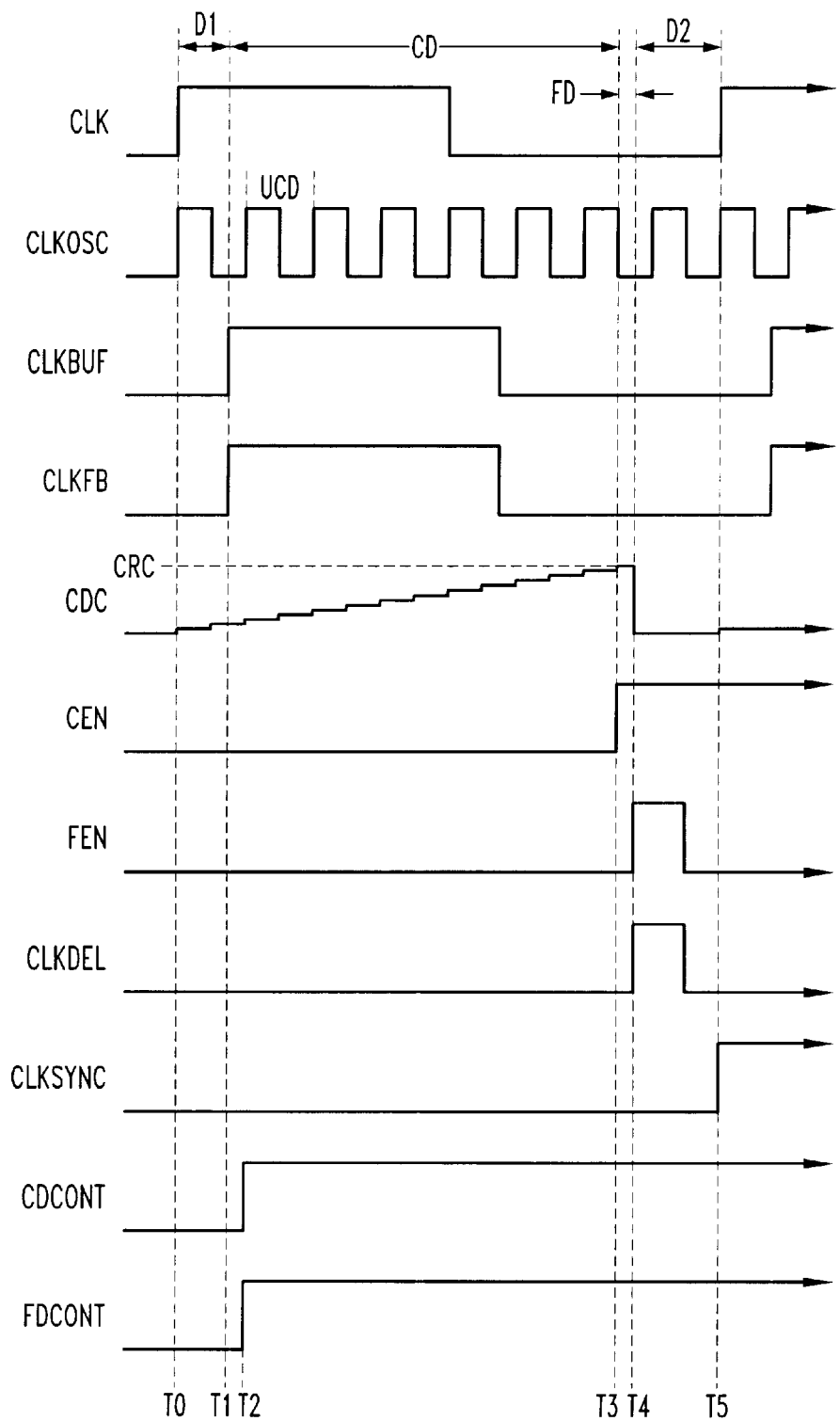
FIG. 4 is a signal timing diagram illustrating various signals generated during operation of the delay-locked loop of FIG. 3.

The overall operation of the delay-locked loop 300 will now be described in more detail with reference to the block diagram of FIG. 3 and a signal timing diagram of FIG. 4 that illustrates various signals generated by the delay-locked loop during operation. In the example of FIG. 4, the coarse delay counter 320 is initially reset to reset the CDC count to zero, and initially the CEN signal from the digital comparator 322 is inactive since the CDC and CRC counts are not equal. At a time T0, the CLKOSC signal begins clocking the coarse delay counter 320 which, in turn, begins incrementing the CDC count. In response to a rising-edge of the CLK signal at the time T0, the CLKBUF signal goes high the input buffer delay D1 later at a time T1. In the example of FIG. 4, the CLKFB signal from the feedback delay line 312 also transitions high at the time T1, which corresponds to the delay-locked loop 300 being locked. In response to rising-edge is all the CLKBUF and CLKFB signals at the time T1, the phase detector 310 generates the CDCONT and FDCONT signals at a time T2 just after the time T1 in response to the relative phases of these signals. Note that the CDCONT and FDCONT signals are illustrated as going high at the time T2 merely for ease of explanation, when actually these signals may toggle several times. For example, the FDCONT signal may toggle three times to change the active FDS1–5 signal from the FDS1 signal to the FDS4 signal, and similarly the CDCONT signal may toggle five times to increment the CRC count to a value CRC+5.

At this point, the coarse delay counter 320 increments the CDC count in response to each transition of the CLKOSC signal from the ring oscillator 302, as illustrated in FIG. 4. At a time T3, the CDC count generated by the coarse delay counter 320 equals a CRC counter of the coarse reference counter 318, causing the digital comparator 322 to activate the CEN signal. At this point, the AND gate 314 receives the high CEN signal and a low FEN signal from the transmission gates 326A–E, and thus maintains the CLKDEL signal low. As the CLKOSC signal propagates through the inverters 324A–E, the transmission gate 326A–E that is activated by the corresponding FDS1–5 signal activates the FEN signal at a time T4. In response to the activated FEN signal, the AND gate 314 drives the CLKDEL signal high at the time T4. The interval T3–T4 defines the fine delay FD of the CLKDEL signal. In this way, the fine delay FD of the CLKDEL signal is adjusted by selecting different tap signals T1–T5 from the ring oscillator 302. Although not explained in detail, one skilled in the art will appreciate that the logic level of the selected tap clock signal T1–T5 being output as the FEN signal may need to be adjusted by the transmission gates 326A–E to ensure that a high signal is applied to activate the AND gate 314.

The output buffer 316 receives the CLKDEL signal and drives the CLKSYNC signal high at a time T5 in synchronism with a rising-edge of the CLK signal. Also in response to the rising-edge transition of the CLKDEL signal at the time T4, the coarse delay counter 320 resets the CDC count to zero, causing the digital comparator 322 to deactivate the CEN signal. When a CEN signal is deactivated, the AND gate 314 drives the CLKDEL signal low as indicated in FIG. 4. In this way, the delay-locked loop 300 generates the CLKSYNC signal having a rising-edges that are synchronized with rising-edges of a CLK signal.

The delay-locked loop 300 utilizes the ring oscillator 302 to clock the coarse delay counter 320 to thereby generate the CDC count which determines the coarse delay CD of the CLKDEL signal. Moreover, the tap clock signals T1–T5 from the ring oscillator 302 are utilized to determine the fine delay FD of the CLKDEL signal. Thus, the ring oscillator 302 is utilized in place of the variable delay line 102 previously described with reference to the conventional delay-locked loop 100 of FIG. 1. The ring oscillator 302 can typically be formed in a much smaller area on a semiconductor substrate in which the delay-locked loop 100 than can the variable delay line 102, and also typically consumes less power than the variable delay line. Moreover, the use of the single ring oscillator 302 in timing the coarse delay CD and the fine delay FD means that the resolution of the delay-locked loop 300 is not adversely affected by the variations between the unit coarse delay UCD and unit fine delays UFD, which may occur when separate coarse and fine delay lines are utilized, as previously described.

Figure 5:
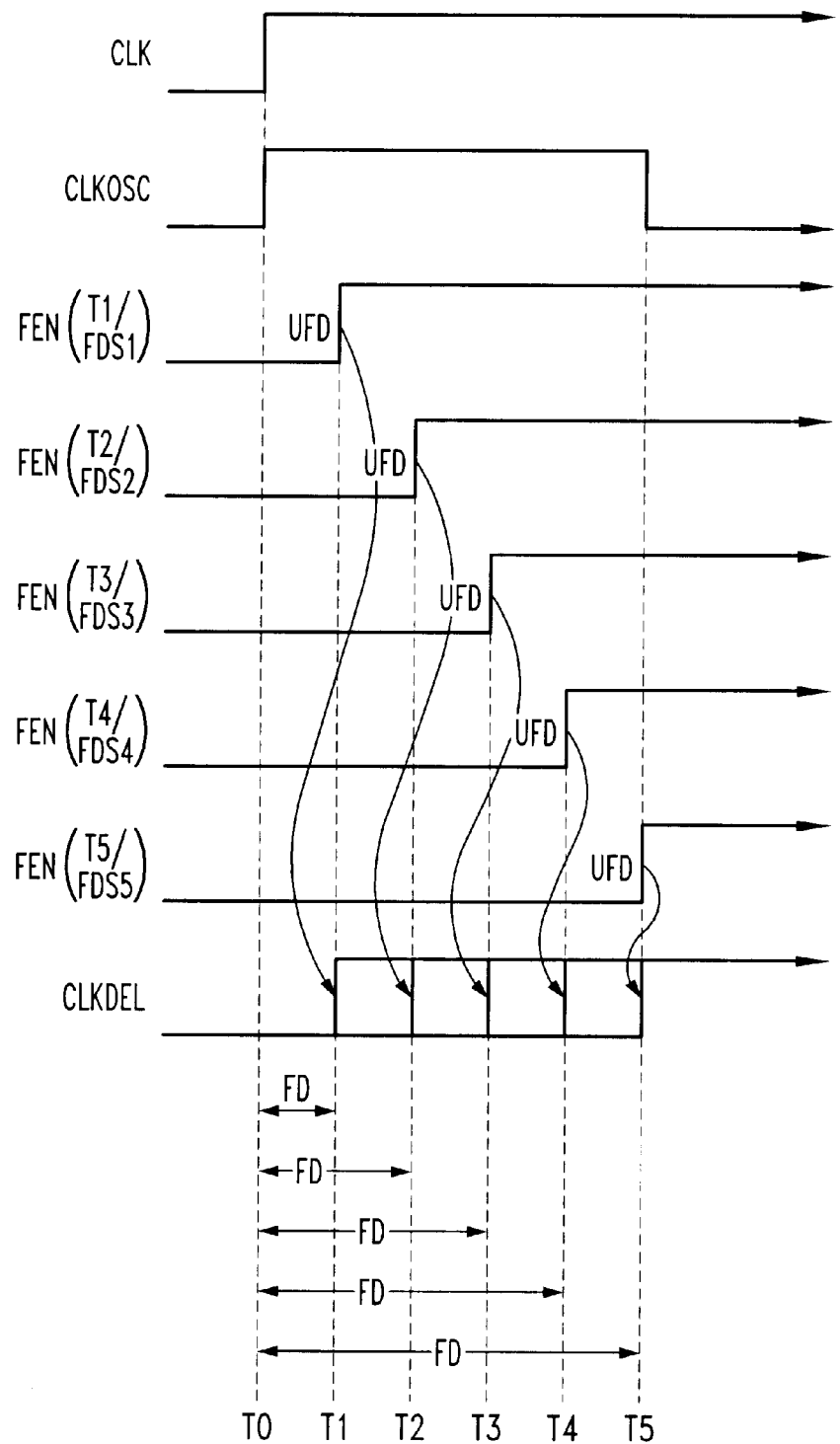
FIG. 5 is a signal timing diagram illustrating the operation of the delay-locked loop of FIG. 3 in adjusting a fine delay a delayed clock signal.

FIG. 5 is a signal timing diagram illustrating in more detail the generation of the FEN signal, and the timing of the signal when the various transmission gates 326A–E are activated. In the example of FIG. 5, the CLK and CLKOSC signals transition high at a time T0. When the FDS1 signal is activated, the transmission gate 326A outputs the tap clock signal T1 as the FEN signal at a time T1, which is one unit fine delay UFD after the rising-edge of the clkosc signal at the time T0. When the FDS2 signal is activated, the transmission gate 326B outputs the tap clock signal T2 as the FEN signal at a time T2, which is two unit fine delays UFD after the rising-edge of the CLKOSC signal at the time T0, and so on at times T3–T5 when the FDS3–5 signals are activated, respectively. In this way, the fine delay FD of the CLKDEL signal is adjusted.

Figure 6:
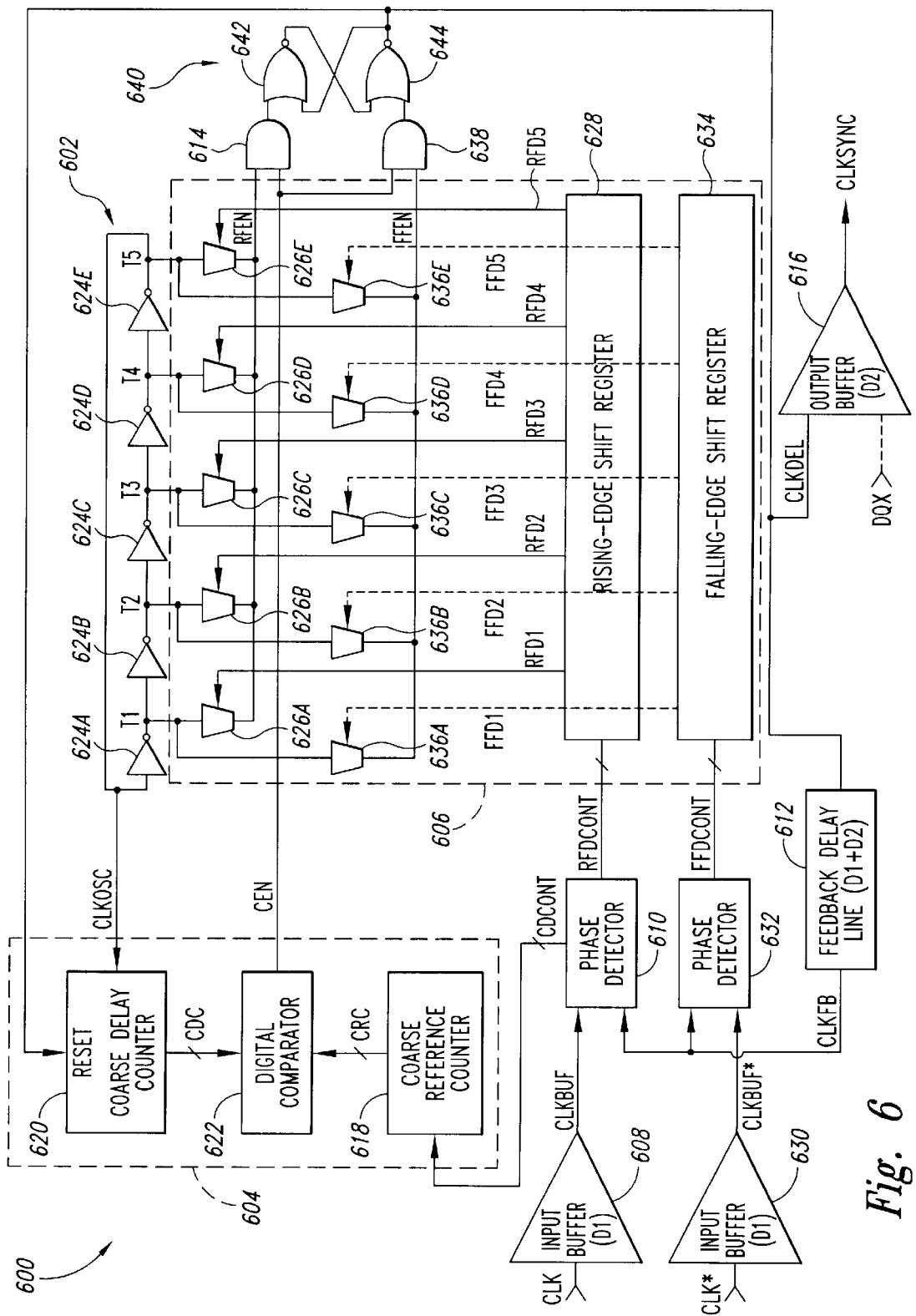
FIG. 6 a functional block diagram of a delay-locked loop that includes a ring oscillator and delay counters to lock on both the rising and falling edges of an applied clock signal according to another embodiment of the present invention.

FIG. 6 is a functional block diagram illustrating a delay-locked loop 600 including a ring oscillator 602 and coarse delay circuitry 604 and fine delay circuitry 606 the operating combination to generate a synchronized clock signal CLKSYNC having been with rising and falling edges synchronized with an applied clock signal CLK, as will now be explained in more detail. In the delay-locked loop 600, the components 608–628 operate in the same way as the previously described components 308–328 in the delay-locked loop 300 of FIG. 3, and thus, for the sake of brevity, the operation of these components will not again be described detail. It should be noted that the FDCONT, FDS1–5, FEN signals of FIG. 3 have been preceded by the letter "R" in FIG. 6 to indicate that these signals deal with synchronizing the rising-edge of the CLK signal. Furthermore, the output from the AND gate 614 is designated as a rising edge strobe signal RES, but corresponds to the output from the AND gate 314 in FIG. 3.

The delay-locked loop 600 further includes an input buffer 630 that receives a complementary applied clock signal CLK* that is the complement of the CLK signal, and generates a complementary clock buffer signal CLKBUF*signal in response to the CLK* signal. A falling-edge phase detector 632 receives the CLKBUF* signal and the CLKFB signal, and generates a falling-edge fine delay control signal FFDCONT signal in response to the relative phases of these signals. The FFDCONT signal is applied to control a falling edge shift register 634 that operates in combination with a plurality of transmission gates 636A–E in the same way as previously described for the shift register 328 and transmission gates 326A–E of FIG. 3 to output a selected one of the tap clock signals T1–T5 as a falling-edge fine delay and enable signal FFEN. An AND gate 638 receives the CEN and FFEN signals and activates a falling edge strobe signal FES when both these signals are high. An RS flip-flop 640 formed by cross-coupled NOR dates 642 and 644 receives the RES and FES signals on set and reset inputs, respectively, and generates the CLKDEL signal on an output in response to the signals. When the RES signal goes active high, the flip-flop 640 drives the CLKDEL signal high, and conversely when the FES signal goes active high the flip-flop drives the CLKDEL signal active high. The output buffer 616 receives the CLKDEL signal and generates the CLKSYNC signal in response to the signal, as previously described.

In operation, the components 608–628 operate in combination in the same way as previously described for the corresponding components 308–328 in the delay-locked loop 300 of FIG. 3 to generate the RES signal having a coarse delay CD determined by the CRC count and a rising-edge fine delay RFD determined by the tap clock signal T1–T5 selected by the phase detector 610, rising-edge shift register 628, and transmission gates 626A–E. In response to the RES signal going active high, the flip-flop 640 drives the CLKDEL signal high and the output buffer 616 drives the CLKSYNC signal high the output buffer delay D2 later and in synchronism with a rising-edge of the CLK signal. In response to the rising-edge of the CLKDEL signal, the coarse delay counter 620 is reset and the CEN signal is once again activated when the CDC and CRC counts are equal. At this point, the falling-edge shift register 634 selects one of the tap clock signals T1–T5 and applies the selected signal as the FFEN signal to the AND gate 638 which, in turn, activates the FES signal. In response to the active FES signal, the flip-flop 640 drives the CLKDEL signal low and the output buffer 616 drives the CLKSYNC signal low output buffer delay D2 later and in synchronism with a falling-edge of the CLK signal. In this way, the delay-locked loop 600 synchronizes rising and falling edges of the CLKSYNC signal with the rising and falling edges of the CLK signal. Note that the use of the single coarse delay circuitry 604 may be utilized as long as the coarse delay CD for the rising and falling-edges is less than the unit coarse delay UCD, as will be appreciated by those skilled in the art. If this is not true, then two delay-locked loops like the delay-locked loop 300 of FIG. 3 may be utilized to synchronize the rising and falling edges of the CLK and CLKSYNC signals.

Figure 7:
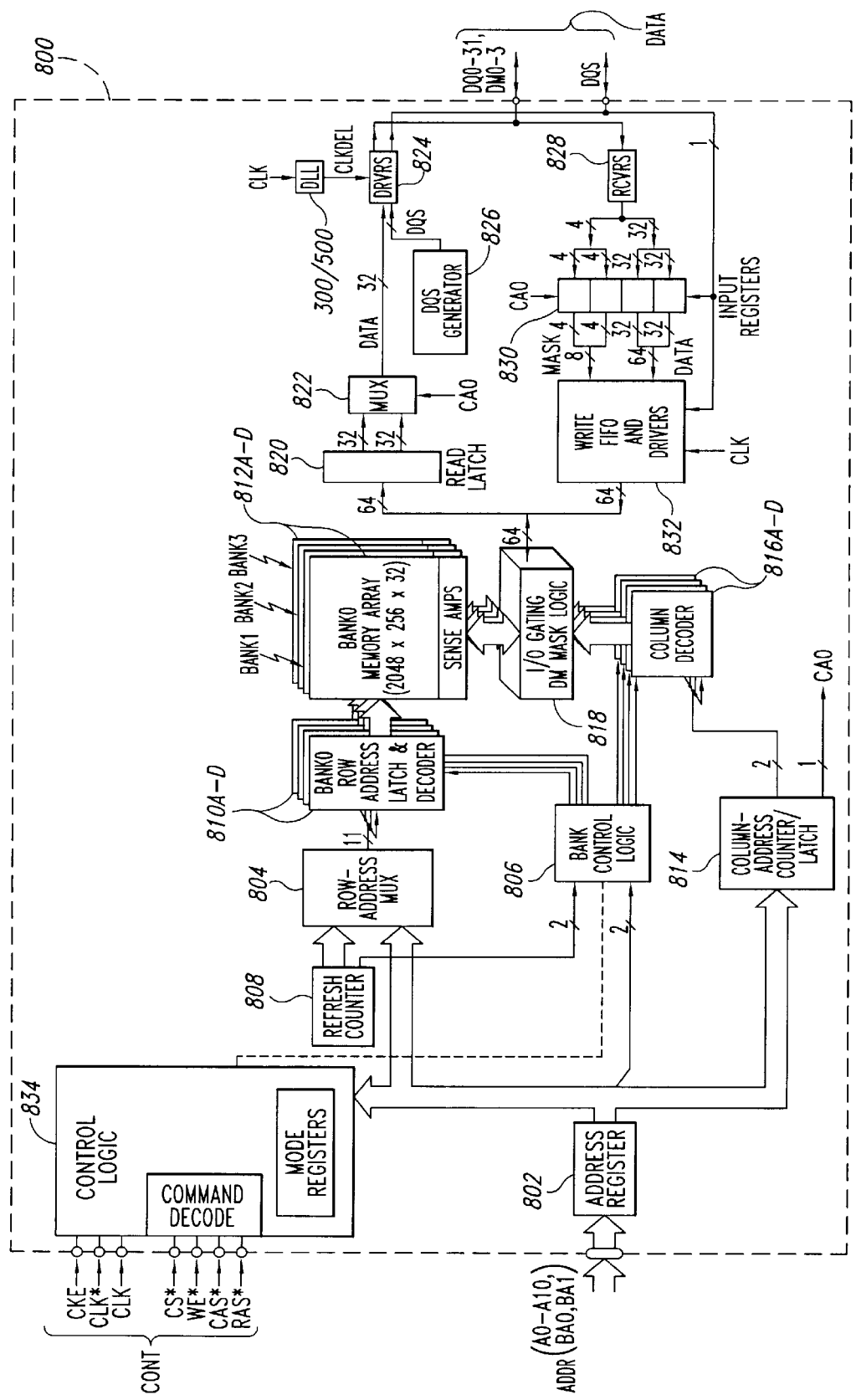
FIG. 7 is a functional block diagram illustrating a synchronous memory device including the delay-locked loop of FIG. 3 and/or the delay-locked loop of FIG. 6.

FIG. 7 is a functional block diagram of a memory device 800 including the delay-locked loop 300 of FIG. 3 and/or the delay-locked loop 600 of FIG. 6. The memory device 800 in FIG. 7 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. In response to the decoded row address, the activated row address latch and decoder 810A–D applies various signals to a corresponding memory bank 812A–D to thereby activate a row of memory cells corresponding to the decoded row address. Each memory bank 812A–D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802 In response to the column address from the counter and latch 814, the activated column decoder 816A–D applies decode and control signals to an I/O gating and data masking circuit 818 which, in turn, accesses memory cells corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer. 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from the delay-locked loop 300/500. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL is a delayed version of the CLK signal, and the delay-locked loop 300/500 adjusts the delay of the CLKDEL signal relative to the CLK signal to ensure that the DQS signal and the DQ words are placed on the DATA bus in synchronism with the CLK signal, as previously described with reference to FIGS. 3–6. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 828 receives each DQ word and the associated DM0-X signals, and applies these signals to input registers 830 that are clocked by the DQS signal. In response to a rising edge of the DQS signal, the input registers 830 latch a first N/2 bit DQ word and the associated DM0-X signals, and in response to a falling edge of the DQS signal the input registers latch the second N/2 bit DQ word and associated DM0-X signals. The input register 830 provides the two latched N/2 bit DQ words as an N-bit word to a write FIFO and driver 832, which clocks the applied DQ word and DM0-X signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM0-X signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802-832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating he control and timing signals is conventional, and thus, for the sake of brevity, will not be described in more detail.

Figure 8:
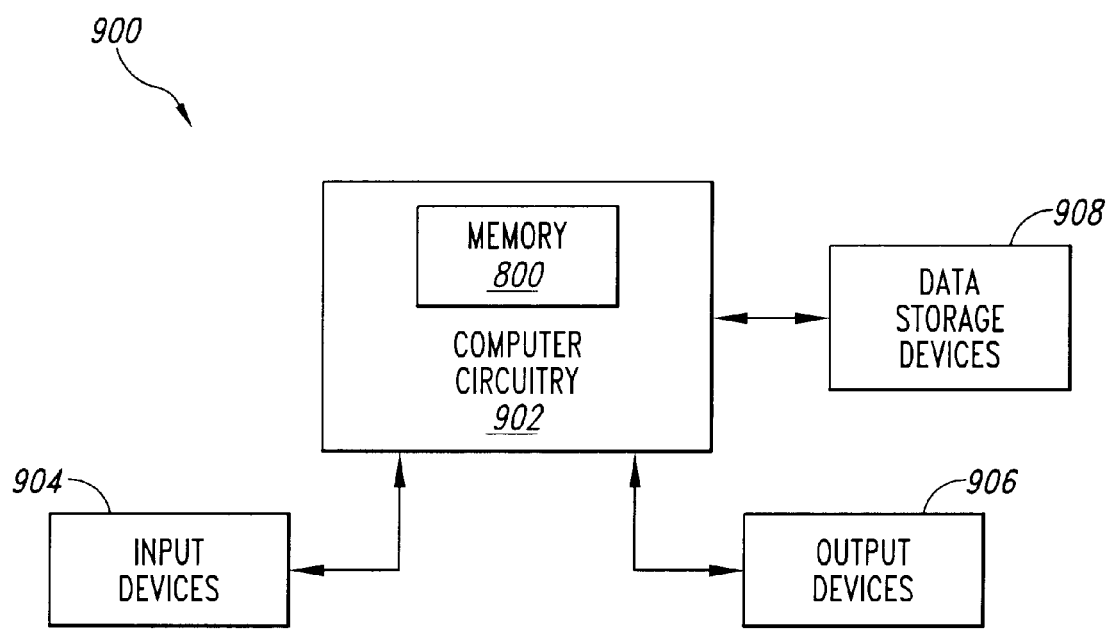
FIG. 8 is a functional block diagram illustrating a computer system including the synchronous memory device of FIG. 7.

FIG. 8 is a block diagram of a computer system 900 including computer circuitry 902 including the memory device 800 of FIG. 7. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A delay-locked loop, comprising:

a ring oscillator operable to generate a plurality of tap clock signals with one tap clock signal being designated an oscillator clock signal, each tap clock signal having a respective delay relative to the oscillator clock signal;

a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;

a fine delay circuit coupled to the ring oscillator to receive the tap clock signals and operable responsive to a fine delay control signal to select one of the tap clock signals and output the selected signal as a fine delay enable signal;

an output circuit coupled to the coarse and fine delay circuits, the output circuit generating a delayed clock signal responsive to the coarse and fine delay enable signals going active, and the delayed clock signal being applied as the reset signal to the coarse delay circuit to reset the coarse delay count; and a comparison circuit adapted to receive an input clock signal and coupled to the output circuit to receive the delayed clock signal, and the comparison circuit being further coupled to the coarse and fine delay circuits, the comparison circuit operable to generate the coarse and fine delay control signals in response to the relative phases of the delayed and input clock signals.

2. The delay-locked loop of claim 1 wherein each increment of the coarse delay reference count equals N×TPD, where N is the number of stages in the ring oscillator and TPD is a propagation delay of each stage, and wherein the comparison circuit determines a phase difference between the delayed and input clock signals and generates the coarse delay control signal to increment or decrement the coarse delay reference count when the determined phase difference is greater than N×TPD until the determined phase difference is less than N×TPD, and thereafter generates the fine delay control signal to select the tap clock signal from the ring oscillator that makes the determined phase difference less than or equal to TPD.

3. The delay-locked loop of claim 1 wherein the coarse delay circuit comprises:

a coarse reference counter coupled to the comparison circuit and operable to develop a coarse reference count responsive to the coarse delay control signal;

a coarse delay counter coupled to the ring oscillator to receive the oscillator clock signal and coupled to output circuit to receive the delayed clock signal, the coarse delay counter developing a coarse delay count responsive to the oscillator clock signal and resetting the coarse delay count responsive to the delayed clock signal; and a comparator circuit coupled to the coarse reference and delay counters, the comparator circuit activating the coarse delay enable signal responsive to the coarse delay count being equal to the coarse reference count.

4. The delay-locked loop of claim 1 wherein the fine delay circuit comprises:

a plurality of transmission gates, each transmission gate including a first signal terminal coupled to the ring oscillator to receive a respective tap clock signal, a second signal terminal coupled to the output circuit, and a control terminal that receives a fine delay selection signal, each transmission gate coupling the first signal terminal to the second signal terminal in response to the fine delay selection signal being activated; and a shift register coupled to the comparison circuit to receive the fine delay control signal and having a plurality of stages, each stage being coupled to the control terminal of a respective transmission gate, the shift register operable responsive to the fine delay control signal to shift an active bit into a selected one of the stages, the active bit activating the corresponding fine delay selection signal to apply the corresponding tap signal as the fine delay enable signal to the output circuit.

5. The delay-locked loop of claim 1 wherein the output circuit comprises an AND gate.

6. The delay-locked loop of claim 1 wherein the comparison circuit comprises:

a feedback delay line that generates a feedback clock signal in response to the delayed clock signal, the feedback clock signal having a feedback delay relative to the delayed clock signal; and a phase detector coupled to receive the feedback clock signal and the input clock signal, and operable to generate the coarse and fine delay control signals responsive to a detected phase between the feedback and input clock signals.

7. The delay-locked loop of claim 6 wherein the phase detector detects the phase between rising-edges of the feedback and input clock signals.

8. The delay-locked loop of claim 6 wherein the feedback delay comprises a first delay and a second delay, the first delay including a delay of an input buffer adapted to receive an external clock signal an develop the input clock signal in response to the external clock signal, and the second delay including a delay of the output circuit and a delay of an output buffer that receives the delayed clock signal and generates a synchronized clock signal in response to the delayed clock signal.

9. A delay-locked loop, comprising:
a ring oscillator operable to generate a plurality of tap clock signals with one tap clock signal being designated an oscillator clock signal, each tap clock signal having a respective delay relative to the oscillator clock signal;
a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;
a rising-edge fine delay circuit coupled to the ring oscillator to receive the tap clock signals and operable responsive to a rising-edge fine delay control signal to select one of the tap clock signals and output the selected signal as a rising-edge fine delay enable signal;
a falling-edge fine delay circuit coupled to the ring oscillator to receive the tap clock signals and operable responsive to a falling-edge fine delay control signal to select one of the tap clock signals and output the selected signal as a falling-edge fine delay enable signal;
an output circuit coupled to the coarse, rising-edge, and falling-edge delay circuits, the output circuit generating a rising-edge of a delayed clock signal responsive to the coarse and rising-edge fine delay enable signals going active, and the output circuit generating a falling-edge of the delayed clock signal responsive to the coarse and falling-edge fine delay enable signals going active, and the delayed clock signal being applied as the reset signal to the coarse delay circuit to reset the coarse delay count responsive to each transition of the delayed clock signal; and
a comparison circuit adapted to receive an input clock signal and coupled to the output circuit to receive the delayed clock signal, and the comparison circuit being further coupled to the coarse and fine delay circuits, the comparison circuit operable to generate the coarse and rising-edge and falling-edge fine delay control signals in response to the relative phases of the rising-edges and falling-edges of the delayed and input clock signals.

10. The delay-locked loop of claim 9 wherein each increment of the coarse delay reference count equals N×TPD, where N is the number of stages in the ring oscillator and TPD is a propagation delay of each stage, and wherein the comparison circuit determines a phase difference between the rising and falling edges of the delayed and input clock signals and generates the coarse delay control signal to increment or decrement the coarse delay reference count when the determined phase difference is greater than N×TPD until the determined phase difference is less than N×TPD, and thereafter generates the rising-edge and falling-edge fine delay control signals to select respective tap clock signals, each selected tap signal making the corresponding phase difference less than or equal to TPD.

11. The delay-locked loop of claim 9 wherein the coarse delay circuit comprises:
a coarse reference counter coupled to the comparison circuit and operable to develop a coarse reference count responsive to the coarse delay control signal;
a coarse delay counter coupled to the ring oscillator to receive the oscillator clock signal and coupled to output circuit to receive the delayed clock signal, the coarse delay counter developing a coarse delay count responsive to the oscillator clock signal and resetting the coarse delay count responsive to the delayed clock signal; and
a comparator circuit coupled to the coarse reference and delay counters, the comparator circuit activating the coarse delay enable signal responsive to the coarse delay count being equal to the coarse reference count.

12. The delay-locked loop of claim 9 wherein each of the fine delay circuits comprises:
a plurality of transmission gates, each transmission gate including a first signal terminal coupled to the ring oscillator to receive a respective tap clock signal, a second signal terminal coupled to the output circuit, and a control terminal that receives a fine delay selection signal, each transmission gate coupling the first signal terminal to the second signal terminal in response to the fine delay selection signal being activated; and
a shift register coupled to the comparison circuit to receive the fine delay control signal and having a plurality of stages, each stage being coupled to the control terminal of a respective transmission gate, the shift register operable responsive to the fine delay control signal to shift an active bit into a selected one of the stages, the active bit activating the corresponding fine delay selection signal to apply the corresponding tap signal as the fine delay enable signal to the output circuit.

13. The delay-locked loop of claim 9 wherein the output circuit comprises:
a first AND gate coupled to receive the coarse delay enable signal and the rising-edge fine delay enable signal on respective inputs, and operable to develop a rising-edge enable signal on an output;
a second AND gate coupled to receive the coarse delay enable signal and the falling-edge fine delay enable signal on respective inputs, and operable to develop a falling-edge enable signal on an output; and
a set-reset flip-flop having a set input coupled the first AND gate and having a reset input coupled to the second AND gate, the flip-flop generating a rising-edge of the delayed clock signal on an output responsive to the set input and generating a falling-edge of the delayed-clock signal responsive to the reset input.

14. The delay-locked loop of claim 9 wherein the comparison circuit comprises:
a feedback delay line that generates a feedback clock signal in response to the delayed clock signal, the feedback clock signal having a feedback delay relative to the delayed clock signal;
a rising-edge phase detector coupled to receive the feedback clock signal and the input clock signal, and operable to generate the coarse and rising-edge fine delay control signals responsive to a detected phase between rising-edges of the feedback and input clock signals; and
a falling-edge phase detector coupled to receive the feedback clock signal and the input clock signal, and operable to generate the coarse and falling-edge fine delay control signals responsive to a detected phase between falling-edges of the feedback and input clock signals.

15. The delay-locked loop of claim 14 wherein the rising-edge and falling-edge phase detectors receive the input clock signal and a complementary input clock signal, respectively.

16. The delay-locked loop of claim 14 wherein the feedback delay comprises a first delay and a second delay, the first delay including a delay of an input buffer adapted to receive an external clock signal an develop the input clock signal in response to the external clock signal, and the second delay including a delay of the output circuit and a delay of an output buffer that receives the delayed clock signal and generates a synchronized clock signal in response to the delayed clock signal.

17. A delay-locked loop, comprising:
- an input buffer circuit adapted to receive an input clock signal and operable to generate a buffered clock signal in response to the input clock signal;
- a ring oscillator operable to generate a plurality of tap clock signals with one tap clock signal being designated an oscillator clock signal, each tap clock signal having a respective delay relative to the oscillator clock signal;
- a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;
- a fine delay circuit coupled to the ring oscillator to receive the tap clock signals and operable responsive to a fine delay control signal to select one of the tap clock signals and output the selected signal as a fine delay enable signal;
- an output circuit coupled to the coarse and fine delay circuits, the output circuit generating a delayed clock signal responsive to the coarse and fine delay enable signals going active, and the delayed clock signal being applied as the reset signal to the coarse delay circuit to reset the coarse delay count; and
- a feedback delay line coupled to the output circuit and operable to generate a feedback clock signal in response to the delayed clock signal, the feedback clock signal having a feedback delay relative to the delayed clock signal;
- a phase detector coupled to the feedback delay line, input buffer, coarse delay circuit, and fine delay circuit, and operable to generate the coarse and fine delay control signals responsive to a detected phase between the buffered and feedback clock signals; and
- an output buffer coupled to the output circuit and operable to generate a synchronized clock signal in response to the delayed clock signal.

18. The delay-locked loop of claim 17 wherein each increment of the coarse delay reference count equals N×TPD, where N is the number of stages in the ring oscillator and TPD is a propagation delay of each stage, and wherein the phase detector determines a phase difference between the buffered and feedback clock signals and generates the coarse delay control signal to increment or decrement the coarse delay reference count when the determined phase difference is greater than N×TPD until the determined phase difference is less than N×TPD, and thereafter generates the fine delay control signal to select the tap clock signal from the ring oscillator that makes the determined phase difference less than or equal to TPD.

19. The delay-locked loop of claim 17 wherein the coarse delay circuit comprises:

- a coarse reference counter coupled to the phase detector and operable to develop a coarse reference count responsive to the coarse delay control signal;
- a coarse delay counter coupled to the ring oscillator to receive the oscillator clock signal and coupled to output circuit to receive the delayed clock signal, the coarse delay counter developing a coarse delay count responsive to the oscillator clock signal and resetting the coarse delay count responsive to the delayed clock signal; and
- a comparator circuit coupled to the coarse reference and coarse delay counters, the comparator circuit activating the coarse delay enable signal responsive to the coarse delay count being equal to the coarse reference count.

20. The delay-locked loop of claim 17 wherein the fine delay circuit comprises:
- a plurality of transmission gates, each transmission gate including a first signal terminal coupled to the ring oscillator to receive a respective tap clock signal, a second signal terminal coupled to the output circuit, and a control terminal that receives a fine delay selection signal, each transmission gate coupling the first signal terminal to the second signal terminal in response to the fine delay selection signal being activated; and
- a shift register coupled to the comparison circuit to receive the fine delay control signal and having a plurality of stages, each stage being coupled to the control terminal of a respective transmission gate, the shift register operable responsive to the fine delay control signal to shift an active bit into a selected one of the stages, the active bit activating the corresponding fine delay selection signal to apply the corresponding tap signal as the fine delay enable signal to the output circuit.

21. The delay-locked loop of claim 17 wherein the output circuit comprises an AND gate.

22. The delay-locked loop of claim 17 wherein the phase detector detects the phase between rising-edges of the feedback and input clock signals.

23. The delay-locked loop of claim 17 wherein the feedback delay comprises a first delay component and a second delay component, the first delay component corresponding to a delay of the input buffer and the second delay component corresponding to a delay of the output buffer.

24. A delay-locked loop, comprising:
- an input buffer circuit adapted to receive an input clock signal and operable to generate a buffered clock signal in response to the input clock signal;
- a ring oscillator operable to generate a plurality of tap clock signals with one tap clock signal being designated an oscillator clock signal, each tap clock signal having a respective delay relative to the oscillator clock signal;
- a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;
- a rising-edge fine delay circuit coupled to the ring oscillator to receive the tap clock signals and operable responsive to a rising-edge fine delay control signal to select one of the tap clock signals and output the selected signal as a rising-edge fine delay enable signal;

a falling-edge fine delay circuit coupled to the ring oscillator to receive the tap clock signals and operable responsive to a falling-edge fine delay control signal to select one of the tap clock signals and output the selected signal as a falling-edge fine delay enable signal;

an output circuit coupled to the coarse, rising-edge, and falling-edge delay circuits, the output circuit generating a rising-edge of a delayed clock signal responsive to the coarse and rising-edge fine delay enable signals going active, and the output circuit generating a falling-edge of the delayed clock signal responsive to the coarse and falling-edge fine delay enable signals going active, and the delayed clock signal being applied as the reset signal to the coarse delay circuit to reset the coarse delay count responsive to each transition of the delayed clock signal;

a feedback delay line coupled to the output circuit and operable to generate a feedback clock signal in response to the delayed clock signal, the feedback clock signal having a feedback delay relative to the delayed clock signal;

a phase detector coupled to the feedback delay line, input buffer, coarse delay circuit, and fine delay circuits, and operable to generate the coarse delay control signal and the rising-edge delay control signal responsive to a detected phase between rising-edges of the buffered and feedback clock signals, and operable to generate the coarse delay control signal and the falling-edge delay control signal responsive to a detected phase between the falling-edges of the buffered and feedback clock signals; and an output buffer coupled to the output circuit and operable to generate a synchronized clock signal in response to the delayed clock signal.

25. The delay-locked loop of claim 24 wherein each increment of the coarse delay reference count equals N×TPD, where N is the number of stages in the ring oscillator and TPD is a propagation delay of each stage, and wherein the phase detector determines a phase difference between the rising-edges of the buffered and feedback clock signals and generates the coarse delay control signal to increment or decrement the coarse delay reference count when the determined phase difference is greater than N×TPD and until the determined phase difference is less than N×TPD, and generates the rising-edge fine delay control signal to select the tap clock signal from the ring oscillator that makes the determined phase difference between rising-edges less than or equal to TPD, and generates the falling-edge fine delay control signal to select the tap clock signal from the ring oscillator that makes the determined phase difference between falling-edges less than or equal to TPD.

26. The delay-locked loop of claim 24 wherein the coarse delay circuit comprises:

a coarse reference counter coupled to the phase detector and operable to develop a coarse reference count responsive to the coarse delay control signal;

a coarse delay counter coupled to the ring oscillator to receive the oscillator clock signal and coupled to output circuit to receive the delayed clock signal, the coarse delay counter developing a coarse delay count responsive to the oscillator clock signal and resetting the coarse delay count responsive to each transition of the delayed clock signal; and a comparator circuit coupled to the coarse reference and delay counters, the comparator circuit activating the coarse delay enable signal responsive to the coarse delay count being equal to the coarse reference count.

27. The delay-locked loop of claim 24 wherein each fine delay circuit comprises:

a plurality of transmission gates, each transmission gate including a first signal terminal coupled to the ring oscillator to receive a respective tap clock signal, a second signal terminal coupled to the output circuit, and a control terminal that receives a fine delay selection signal, each transmission gate coupling the first signal terminal to the second signal terminal in response to the fine delay selection signal being activated; and a shift register coupled to the phase detector to receive the fine delay control signal and having a plurality of stages, each stage being coupled to the control terminal of a respective transmission gate, the shift register operable responsive to the fine delay control signal to shift an active bit into a selected one of the stages, the active bit activating the corresponding fine delay selection signal to apply the corresponding tap signal as the fine delay enable signal to the output circuit.

28. The delay-locked loop of claim 24 wherein the output circuit comprises:

a first AND gate coupled to receive the coarse delay enable signal and the rising-edge fine delay enable signal on respective inputs, and operable to develop a rising-edge enable signal on an output;

a second AND gate coupled to receive the coarse delay enable signal and the falling-edge fine delay enable signal on respective inputs, and operable to develop a falling-edge enable signal on an output; and a set-reset flip-flop having a set input coupled the first AND gate and having a reset input coupled to the second AND gate, the flip-flop generating a rising-edge of the delayed clock signal on an output responsive to the rising-edge enable signal on the set input and generating a falling-edge of the delayed-clock signal responsive to the falling-edge enable signal on the reset input.

29. The delay-locked loop of claim 24 wherein the phase detector comprises:

a rising-edge phase detector coupled to receive the feedback clock signal and the buffered clock signal, and operable to generate the coarse delay control signal and rising-edge fine delay control signal responsive to a detected phase between rising-edges of the feedback and buffered clock signals; and a falling-edge phase detector coupled to receive the feedback clock signal and the buffered clock signal, and operable to generate the coarse delay control signal and falling-edge fine delay control signal responsive to a detected phase between falling-edges of the feedback and buffered clock signals.

30. The delay-locked loop of claim 29 wherein the input buffer comprises:

a first input buffer adapted to receive a true input clock signal and operable to apply a true buffered clock signal to the rising-edge phase detector responsive to the true input clock signal; and a second input buffer adapted to receive a complementary input clock signal and operable to apply a complementary buffered clock signal to the falling-edge phase detector responsive to the complementary input clock signal.

31. The delay-locked loop of claim 24 wherein the feedback delay comprises a first delay and a second delay, the first delay including a delay of the input buffer and the second delay including a delay of the output circuit.

32. A memory device, comprising:
  an address bus;
  a control bus;
  a data bus;
  an address decoder coupled to the address bus;
  a read/write circuit coupled to the data bus;
  a control circuit coupled to the control bus;
  a memory-cell array coupled to the address decoder, control circuit, and read/write circuit; and
  a delay-locked loop coupled to at least the control circuit and adapted to receive an input clock signal, the delay-locked loop operable to generate a delayed clock signal and the control circuit generating control signals in response to the delayed clock signal, the delay-locked loop comprising,
  a ring oscillator operable to generate a plurality of tap clock signals with one tap clock signal being designated an oscillator clock signal, each clock signal having a respective delay relative to the oscillator clock signal;
  a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;
  a fine delay circuit coupled to the ring oscillator to receive the tap clock signals and operable responsive to a fine delay control signal to select one of the tap clock signals and output the selected signal as a fine delay enable signal;
  an output circuit coupled to the coarse and fine delay circuits, the output circuit generating a delayed clock signal responsive to the coarse and fine delay enable signals going active, and the delayed clock signal being applied as the reset signal to the coarse delay circuit to reset the coarse delay count; and
  a comparison circuit adapted to receive the input clock signal and coupled to the output circuit to receive the delayed clock signal, and the comparison circuit being further coupled to the coarse and fine delay circuits, the comparison circuit operable to generate the coarse and fine delay control signals in response to the relative phases of the delayed and input clock signals.

33. The memory device of claim 32 wherein the memory device comprises a DDR SDRAM and the delay-locked loop receives complementary input clock signals and generates the delayed clock signal that is synchronized to the rising and falling edges of the clock signals, the delayed clock signal being applied to clock an output driver coupled to the data bus.

34. The memory device of claim 32 wherein each increment of the coarse delay reference count equals N×TPD, where N is the number of stages in the ring oscillator and TPD is a propagation delay of each stage, and wherein the comparison circuit determines a phase difference between the delayed and input clock signals and generates the coarse delay control signal to increment or decrement the coarse delay reference count when the determined phase difference is greater than N×TPD until the determined phase difference is less than N×TPD, and thereafter generates the fine delay control signal to select the tap clock signal from the ring oscillator that makes the determined phase difference less than or equal to TPD.

35. A computer system, comprising:
  a data input device;
  a data output device;
  a processor coupled to the data input and output devices; and
  a memory device coupled to the processor, the memory device comprising,
    an address bus;
    a control bus;
    a data bus;
    an address decoder coupled to the address bus;
    a read/write circuit coupled to the data bus;
    a control circuit coupled to the control bus;
    a memory-cell array coupled to the address decoder, control circuit, and read/write circuit; and
    a delay-locked loop coupled to at least the control circuit and adapted to receive an input clock signal, the delay-locked loop operable to generate a delayed clock signal and the control circuit generating control signals in response to the delayed clock signal, the delay-locked loop comprising,
  signals a ring oscillator operable to generate a plurality of tap clock signals with one tap clock signal being designated an oscillator clock signal, each clock signal having a respective delay relative to the oscillator clock signal;
  a coarse delay circuit coupled to the ring oscillator and operable to generate a coarse delay count responsive to the oscillator clock signal, the coarse delay circuit further operable to generate a coarse reference count in response to a coarse delay control signal and to activate a coarse delay enable signal responsive to the coarse delay count being equal to the coarse delay reference count, and the coarse delay circuit resetting the coarse delay count responsive to a reset signal;
  a fine delay circuit coupled to the ring oscillator to receive the tap clock signals and operable responsive to a fine delay control signal to select one of the tap clock signals and output the selected signal as a fine delay enable signal;
  an output circuit coupled to the coarse and fine delay circuits, the output circuit generating a delayed clock signal responsive to the coarse and fine delay enable signals going active, and the delayed clock signal being applied as the reset signal to the coarse delay circuit to reset the coarse delay count; and
  a comparison circuit adapted to receive the input clock signal and coupled to the output circuit to receive the delayed clock signal, and the comparison circuit being further coupled to the coarse and fine delay circuits, the comparison circuit operable to generate the coarse and fine delay control signals in response to the relative phases of the delayed and input clock signals.

36. The computer system of claim 35 wherein the memory device comprises a DDR SDRAM and the delay-locked loop receives complementary input clock signals and generates the delayed clock signal that is synchronized to the rising and falling edges of the clock signals, the delayed clock signal being applied to clock an output driver coupled to the data bus.

37. The computer system of claim 35 wherein each increment of the coarse delay reference count equals N×TPD, where N is the number of stages in the ring oscillator and TPD is a propagation delay of each stage, and wherein the comparison circuit determines a phase difference between the delayed and input clock signals and generates the coarse delay control signal to increment or decrement the coarse delay reference count when the determined phase difference is greater than N×TPD until the determined phase difference is less than N×TPD, and thereafter generates the fine delay control signal to select the tap clock signal from the ring oscillator that makes the determined phase difference less than or equal to TPD.

38. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

detecting a phase difference between the applied clock signal and the delayed clock signal;

generating a coarse reference count in response to the detected phase difference;

incrementing a coarse delay count responsive to the reference oscillator clock signal;

determining a coarse delay time when the coarse reference count equals the coarse delay count;

selecting one of the oscillator clock signals in response to the detected phase difference between the applied and delayed clock signals;

determining a fine delay time from the selected oscillator clock signal;

generating the delayed clock signal having a delay relative to the applied clock signal that equals the sum of the coarse and fine delay times; and repeating the operations of detecting a phase difference between the applied clock signal and the delayed clock signal through generating the delayed clock signal having a delay relative to the applied clock signal that equals the sum of the coarse and fine delay times until the delayed clock signal has a locked delay relative to the applied clock signal.

39. The method of claim 38 wherein detecting a phase difference between the applied clock signal and the delayed clock signal comprises delaying the delayed clock signal by a model delay to generate a feedback clock signal, and detecting the phase difference between the feedback clock signal and the applied clock signal.

40. The method of claim 38 wherein the locked value corresponds to the applied clock signal being delayed relative to the delayed clock signal by an output buffer delay time.

41. The method of claim 38 further comprising clocking data in response to the delayed clock signal.

42. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

detecting a phase difference between rising-edges of the applied and delayed clock signals;

detecting a phase difference between falling-edges of the applied and delayed clock signals;

generating a coarse reference count in response to the detected phase difference;

incrementing a coarse delay count responsive to the reference oscillator clock signal;

determining a coarse delay time when the coarse reference count equals the coarse delay count;

selecting one of the oscillator clock signals in response to the detected phase difference between the rising-edges of the applied and delayed clock signals;

determining a rising-edge fine delay time from the selected oscillator clock signal;

generating a rising-edge of the delayed clock signal having a delay relative to the applied clock signal that equals the sum of the coarse delay time and the rising-edge fine delay time;

selecting one of the oscillator clock signals in response to the detected phase difference between the falling-edges of the applied and delayed clock signals;

determining a falling-edge fine delay time from the selected oscillator clock signal;

generating a falling-edge of the delayed clock signal having a delay relative to the applied clock signal that equals the sum of the coarse delay time and the falling edge fine delay time; and repeating the operations of detecting a phase difference between rising-edges through generating a falling-edge of the delayed clock signal until the delayed clock signal has a locked delay relative to the applied clock signal.

43. The method of claim 42 wherein the applied clock signal comprises a true applied clock signal and a complementary applied clock signal, and wherein detecting a phase difference between rising-edges of the applied clock signal and the delayed clock signal comprises delaying the delayed clock signal by a model delay to generate a feedback clock signal and detecting the phase difference between rising-edges of the feedback and the true applied clock signals, and wherein detecting a phase difference between falling-edges the applied clock signal and the delayed clock signal comprises detecting the phase difference between a rising-edge of the complementary applied clock signal and a falling-edge of the feedback clock signal.

44. The method of claim 42 wherein the locked value corresponds to the applied clock signal being delayed relative to the delayed clock signal by an output buffer delay time.

45. The method of claim 42 further comprising clocking data in response to the delayed clock signal.

* * * * *

UNITED STATES PATENT AND TRADEMARK OFFICE
CERTIFICATE OF CORRECTION

PATENT NO. : 6,759,911 B2  
APPLICATION NO. : 09/989209  
DATED : July 6, 2004  
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Item (73) | "Assignee: Mcron Technology, Inc., Boise, ID (US)" | --Assignee: Micron Technology, Inc., Boise, ID (US)-- |
| Title Page Item (56), References Cited, U.S. Patent Documents | [Omitted references] | 5,233,316 8/93 Yamada et al..........331/45<br>5,757,218 5/98 Blum..................327/175<br>6,330,197 B1 12/01 Currin et al.......365/194<br>6,480,047 B2 11/02 Abdel-Maguid et al.....327/161 |
| Title Page Item (56), References Cited Other Publications, Jang Reference | "Jang, Seong-Jin et al., A Compact Ring Delay Line for High Speed Synchronous DRAM, IEEE Symposium on VLSI Circuits Digest of Technical Papers, 1998, pp. 60-61." | --Jang, Seong-Jin, "A Compact Ring Delay Line for High Speed Synchronous DRAM," IEEE Symposium on VLSI Circuits Digest of Technical Papers, 1998, pp. 60-61.-- |
| Title Page Item (56), References Cited, Other Publications, Kuge Reference | "Post-Molding-Tuning Method" | --Post-Mold-Tuning Method-- |
| Item (56) References Cited, Other Publications, Takai Reference | "Takai, Yashiro et al., A 250Mb/s/pin 1Gb Double Data Rate SRAM with a Bi-Directional Delay and An Inter-Bank Shared Redundancy Scheme, 1999." | --Takai, Yashiro, et al., "A 250Mb/s/pin 1Gb Double Data Rate SRAM with a Bi-Directional Delay and an Inter-Bank Shared Redundancy Scheme," 1999.-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Column 2, Line 54 | "signal is adjusted the" | --signal is adjusted, the-- |
| Column 3, Line 16 | "VD as a value" | --VD has a value-- |
| Column 3, Line 26 | "CLKBUF occurs" | --CLKBUF signal occurs-- |
| Column 3, Line 43 | "which in this case, is" | --which in this case is-- |
| Column 3, Line 48 | "the relative, phases" | --the relative phases-- |
| Column 3, Line 60 | "signal the phase detector" | --signal of the phase detector-- |
| Column 5, Line 60 | "a delayed clock signal." | --of a delayed clock signal.-- |
| Column 6, Line 31 | "buffer delay. D1 relative" | --buffer delay D1 relative-- |
| Column 6, Line 32 | "receives CLKBUF" | --receives the CLKBUF-- |
| Column 8, Lines 11-15 | "In response to rising-edge is all the CLKBUF and CLKFB signals at the time T1, the phase detector 310 generates the CDCONT and FDCONT signals at a time T2 just after the time T1 in response to the relative phases of these signals." | --In response to a rising-edge of the CLKBUF and CLKFB signals at the time T1, the phase detector 310 generates the CDCONT and FDCONT signals at a time T2 just after the time T1.-- |
| Column 8, Line 55 | "having a rising-edges" | --having rising-edges-- |
| Column 8, Line 67 | "substrate in which the delay-locked loop" | --substrate in the delay-locked loop-- |
| Column 9, Line 4 | "means that-the resolution" | --means that the resolution-- |
| Column 9, Line 15 | "the clkosc signal" | --the CLKOSC signal-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Column 9, Line 24 | "oscillator 602 and coarse" | --oscillator 602, coarse-- |
| Column 9, Line 25 | "circuitry 606 the operating" | --circuitry 606, operating in-- |
| Column 9, Line 27 | "having been with rising" | --having rising-- |
| Column 9, Line 33-34 | "described detail." | --described in detail.-- |
| Column 9, Line 58 | "NOR dates 642" | --NOR gates 642-- |
| Column 11, Line 38 | "two 32 bits" | --two 32 bit-- |
| Column 11, Line 45 | "received N/2 bits words" | --received N/2 bit words-- |
| Column 14, Line 11 | "coupled to output" | --coupled to the output-- |
| Column 14, Line 63 | "signal an develop" | --signal and develop-- |
| Column 15, Line 67 | "coupled to output" | --coupled to the output-- |
| Column 16, Line 40 | "coupled the first" | --coupled to the first-- |
| Column 17, Line 4 | "signal an develop" | --signal and develop-- |
| Column 18, Line 5 | "to output" | --to the output-- |
| Column 19, Line 62 | "to output" | --to the output-- |
| Column 20, Line 35 | "coupled the first" | --coupled to the first-- |
| Column 22, Lines 26-27 | "delay-locked loop comprising, signals a ring oscillator" | --delay-locked loop comprising a ring oscillator-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Column 24, Line 50 | "falling-edges" | --falling-edges of-- |

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Item (73) | "Assignee: Mcron Technology, Inc., Boise, ID (US)" | --Assignee: Micron Technology, Inc., Boise, ID (US)-- |
| Title Page Item (56), References Cited, U.S. Patent Documents | [Omitted references] | 5,233,316 8/1993 Yamada et al..........331/45<br>5,757,218 5/1998 Blum.................327/175<br>6,069,508 5/2000 Takai................327/175<br>6,107,891 8/2000 Coy...................331/183<br>6,330,197 B1 12/2001 Currin et al.......365/194<br>6,373,307 B1 4/2002 Takai................327/161<br>6,480,047 B2 11/2002 Abdel-Maguid et al.....327/161<br>2002/0176315 A1 11/2002 Graaff...............365/233<br>2002/0180499 A1 12/2002 Kim et al.............327/158 |
| Title Page Item (56), References Cited Other Publications, Jang Reference | "Jang, Seong-Jin et al., A Compact Ring Delay Line for High Speed Synchronous DRAM, IEEE Symposium on VLSI Circuits Digest of Technical Papers, 1998, pp. 60-61." | --Jang, Seong-Jin et al., "A Compact Ring Delay Line for High Speed Synchronous DRAM," IEEE Symposium on VLSI Circuits Digest of Technical Papers, 1998, pp. 60-61.-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Title Page Item (56), References Cited, Other Publications, Kuge Reference | "Post-Molding-Tuning Method" | --Post-Mold-Tuning Method-- |
| Item (56) References Cited, Other Publications, Takai Reference | "Takai, Yashiro et al., A 250Mb/s/pin 1Gb Double Data Rate SRAM with a Bi-Directional Delay and An Inter-Bank Shared Redundancy Scheme, 1999." | --Takai, Yashiro, et al., "A 250Mb/s/pin 1Gb Double Data Rate SRAM with a Bi-Directional Delay and an Inter-Bank Shared Redundancy Scheme," 1999.-- |
| Column 2, Line 54 | "signal is adjusted the" | --signal is adjusted, the-- |
| Column 3, Line 16 | "VD as a value" | --VD has a value-- |
| Column 3, Line 26 | "CLKBUF occurs" | --CLKBUF signal occurs-- |
| Column 3, Line 43 | "which in this case, is" | --which in this case is-- |
| Column 3, Line 48 | "the relative, phases" | --the relative phases-- |
| Column 3, Line 60 | "signal the phase detector" | --signal of the phase detector-- |
| Column 5, Line 60 | "a delayed clock signal." | --of a delayed clock signal.-- |
| Column 6, Line 31 | "buffer delay. D1 relative" | --buffer delay D1 relative-- |
| Column 6, Line 32 | "receives CLKBUF" | --receives the CLKBUF-- |
| Column 8, Lines 11-15 | "In response to rising-edge is all the CLKBUF and CLKFB signals at the time T1, the phase detector 310 generates the CDCONT and FDCONT signals at a time T2 just after the time T1 in response to the relative phases of these signals." | --In response to a rising-edge of the CLKBUF and CLKFB signals at the time T1, the phase detector 310 generates the CDCONT and FDCONT signals at a time T2 just after the time T1.-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Column 8, Line 55 | "having a rising-edges" | --having rising-edges-- |
| Column 8, Line 67 | "substrate in which the delay-locked loop" | --substrate in the delay-locked loop-- |
| Column 9, Line 4 | "means that-the resolution" | --means that the resolution-- |
| Column 9, Line 15 | "the clkosc signal" | --the CLKOSC signal-- |
| Column 9, Line 24 | "oscillator 602 and coarse" | --oscillator 602, coarse-- |
| Column 9, Line 25 | "circuitry 606 the operating" | --circuitry 606, operating in-- |
| Column 9, Line 27 | "having been with rising" | --having rising-- |
| Column 9, Line 33-34 | "described detail." | --described in detail.-- |
| Column 9, Line 58 | "NOR dates 642" | --NOR gates 642-- |
| Column 11, Line 38 | "two 32 bits" | --two 32 bit-- |
| Column 11, Line 45 | "received N/2 bits words" | --received N/2 bit words-- |
| Column 14, Line 11 | "coupled to output" | --coupled to the output-- |
| Column 14, Line 63 | "signal an develop" | --signal and develop-- |
| Column 15, Line 67 | "coupled to output" | --coupled to the output-- |
| Column 16, Line 40 | "coupled the first" | --coupled to the first-- |
| Column 17, Line 4 | "signal an develop" | --signal and develop-- |
| Column 18, Line 5 | "to output" | --to the output-- |
| Column 19, Line 62 | "to output" | --to the output-- |

UNITED STATES PATENT AND TRADEMARK OFFICE
CERTIFICATE OF CORRECTION

PATENT NO. : 6,759,911 B2
APPLICATION NO. : 09/989209
DATED : July 6, 2004
INVENTOR(S) : Tyler J. Gomm, Frank Alejano and Howard C. Kirsch It is certified that error appears in the above-identified patent and that said Letters Patent is hereby corrected as shown below:

| Column, Line | Reads | Should Read |
|---|---|---|
| Column 20, Line 35 | "coupled the first" | --coupled to the first-- |
| Column 22, Lines 26-27 | "delay-locked loop comprising, signals a ring oscillator" | --delay-locked loop comprising a ring oscillator-- |
| Column 24, Line 50 | "falling-edges" | --falling-edges of-- |

This certificate supersedes the Certificate of Correction issued June 3, 2008.

Signed and Sealed this

Fifteenth Day of September, 2009

David J. Kappos
*Director of the United States Patent and Trademark Office*